United States Patent
Hsu

(10) Patent No.: US 7,292,625 B2
(45) Date of Patent: Nov. 6, 2007

(54) DOWNSTREAM POWER CALIBRATION METHOD ON CABLE MODEM

(75) Inventor: Chi-Tung Hsu, Taipei (TW)

(73) Assignee: Askey Computer Corp., Taipei (TW)

( * ) Notice: Subject to any disclaimer, the term of this patent is extended or adjusted under 35 U.S.C. 154(b) by 1456 days.

(21) Appl. No.: 10/047,187

(22) Filed: Jan. 17, 2002

(65) Prior Publication Data

US 2003/0135866 A1    Jul. 17, 2003

(51) Int. Cl.
H04B 1/38    (2006.01)
H04B 3/46    (2006.01)
H04B 17/00   (2006.01)

(52) U.S. Cl. ................................. 375/222; 375/224
(58) Field of Classification Search ............. 375/219, 375/222, 224, 227
See application file for complete search history.

(56) References Cited

U.S. PATENT DOCUMENTS 6,782,335 B1 * 8/2004 Lynaugh et al. ............ 702/107

* cited by examiner

*Primary Examiner*—David B. Lugo
(74) *Attorney, Agent, or Firm*—Browdy and Neimark, PLLC

(57) ABSTRACT

A downstream power calibration method comprises the following procedures. First, select base sampling frequencies and sampling power levels, thereby generating base sampling signals. Next, input base sampling signals into a modem such that obtaining each sum of the feedback signals responding to the tuner and the IF amplifier of the modem by the modem chip corresponding each said base sampling signal, thereby setting up a sampling data table. Third, repeat the procedure mention above for a plurality of modems to get a plurality of sampling data tables respectively, and then obtain a mean data table. Fourth, select spot frequencies and spot power levels from the base sampling frequencies and the base sampling power levels to generate spot sampling signals. Thereafter, input the spot sampling signals into a cable modem and set up a skeleton data table. Finally, expand skeleton data table and obtain an individual default data table for the modem, thereby providing the basis of the calculation of power levels when the cable modem is receiving downstream signals.

6 Claims, 4 Drawing Sheets

Choose spot frequencies and spot power levels from the base sampling frequencies and base sampling power levels to generate a smaller quantity of spot sampling signals.

Set up a skeleton data table for a modem to be calibrated.

Expand data in the skeleton data table from the corresponding said spot power levels into corresponding said base sampling power levels for each spot frequency.

Derive an individual default data table from information in the skeleton table based on the corresponding spot frequencies expanded into corresponding base sampling frequencies for the modem.

FIG. 3

DOWNSTREAM POWER CALIBRATION METHOD ON CABLE MODEM

FIELD OF THE INVENTION

The present invention relates generally to a manufacturing method of a cable modem, and more particularly to a downstream power calibration method on the cable modem.

BACKGROUND OF THE INVENTION

The basic principle of the cable modem involves the modulation of digital signals to radio frequency (RF) signals and the demodulation of RF signals to digital signals that can be processed by a computer.

Referring to FIG. 1, the block diagram of a signal receiving assembly of a conventional cable modem, when downstream signal is inputted into the signal receiving assembly through a cable, the downstream signal is first received by a tuner and the frequency of the downstream signal is thereafter attenuated to an intermediate frequency (IF) by the tuner, and then the downstream signal is admitted into the modem chip for further processing, such as decoding. According to the power level magnitude of the downstream signal inputted into the chip, the chip generates two appropriate feedback signals AGC_T and AGC_I responding to the tuner and the IF amplifier respectively such that the tuner and the IF amplifier can adjust their automatic gain control values accordingly, thereby enabling the power level of the signal inputted into the chip can be controlled under a range that could be handled by the chip.

However, under the Data Over Cable Service Interface Specifications (DOCSIS) protocol, the frequency of downstream signal is required at a range of 88 MHz to 860 MHz, and under the circumstances, the tuner has an uneven frequency response. In addition, discontinuity points will be generated at the overlapping frequency bands, i.e. between low VHF and high VHF bands, or between high VHF and UHF bands. Furthermore, the frequency responses among different tuners are quite different such that each cable modem must be calibrated during production.

The conventional calibration method is first to select 26 frequency values and 18 power level values to generate 468 sampling signals by multiplying 26 by 18 and respectively reading the feedback signal AGC_T and AGC_I values of the modem chip under each sampling signal, thereby setting up a reference table containing 26×18 data for each modem. Thereafter, when the downstream signal is received by the modem, the power level can be calculated from the reference table, the generated values of the feedback signals AGC_T & ACG_I and the value of the frequency of the downstream signal. Please note that there are slight variances between actual inputted power level, but the error is in the tolerance of DOCSIS.

However, since the conventional calibration method requires that a detailed reference data table must be set up for each cable modem, the time spent on signal input and data reads for its set up is extremely lengthy, which results in an inordinate burden on the output rate of cable modem production lines.

SUMMARY OF THE INVENTION

The primary object of the present invention is to provide a downstream power calibration method on cable modem, which is capable of accurate power calibration, while also greatly reducing calibration time and increasing cable modem production rate.

To achieve the disclosed objective, the downstream power calibration method on cable modem is comprised of two major steps: a preliminary operation step and an individual operation step. The preliminary operation step is executed once for the fabricator and then the individual operation step is executed once for each modem. The preliminary operation step comprises the following procedures:

(A) Select a quantity of frequency values to serve as base sampling frequencies and then select a quantity of power level values to serve as base sampling power levels to thereby generate base sampling signals, the quantity of which is equal to the product of the base sampling frequencies multiplied by the base sampling power levels.

(B) Provide a plurality of cable modems and consecutively input the base sampling signals into each modem. For every modem, obtain every sum of the feedback signals responding to the tuner and the IF amplifier of the modem by the modem chip corresponding every said base sampling signal, thereby setting up a sampling data table containing each sum value of the feedback signals corresponding each base sampling signal.

(C) Calculate every mean of the sums of the feedback signals of all the sampling data tables corresponding every same base sampling signal, thereby setting up a mean data table containing each mean value of the sum value of all the sampling data tables corresponding each same base sampling signal.

The individual operation step comprises the following procedures:

(D) Choose a quantity of spot frequencies and spot power levels from the base sampling frequencies and base sampling power levels to generate spot sampling signals, the quantity of which is less than that of the base sampling signals.

(E) Consecutively input the spot sampling signals into a cable modem to be calibrated and obtain every sum of the feedback signals responding to the tuner and the IF amplifier of this modem by its modem chip corresponding every said spot sampling signal, thereby setting up a skeleton data table containing each sum value of the feedback signals corresponding each spot sampling signal.

(F) Expand said sum values in the skeleton data table from corresponding said spot power levels into corresponding said base sampling power levels. For any given spot frequency, the method of the expansion is as follows:

(a) Calculate the sum values corresponding said base sampling power levels excluding those equal to the spot power levels from the sum values corresponding said spot power levels in skeleton data table by interpolation or extrapolation. These calculated sum values are termed arithmetic sum values.

(b) Obtain the mean values of the sum values corresponding said base sampling power levels excluding those equal to the spot power levels in the mean data table. These mean values are termed weighting sum values.

(c) Calculate the computational sum values corresponding said base sampling power levels excluding those equal to the spot power levels in the skeleton data table by the formula as follows:

Computational Sum Value=(Weighting Sum Value× 2+Arithmetic Sum Value)÷3

Therefore, each sum value corresponding each base sampling power level under each spot frequency for the modem is obtained in the skeleton data table.

(G) Interpolate or extrapolate information in the skeleton data table to expand it from the corresponding said spot frequencies into corresponding said base sampling frequencies, thereby expanding the skeleton data table into an individual default data table and providing for the calculation of power levels when the cable modem is receiving downstream signal.

BRIEF DESCRIPTION OF THE DRAWINGS

FIG. 3 is a flow chart of an individual operation step according to the preferred embodiment of the present invention.

DETAILED DESCRIPTION OF THE INVENTION

According to a preferred embodiment of the present invention, the downstream power calibration method on a cable modem is comprised of two major steps: a preliminary operation step (FIG. 2) and an individual operation step (FIG. 3). Generally speaking, when the calibration method of the present invention is utilized, the preliminary operation step must first be executed once for the fabricator, following which the individual operation is executed once for each modem.

Figure 1:
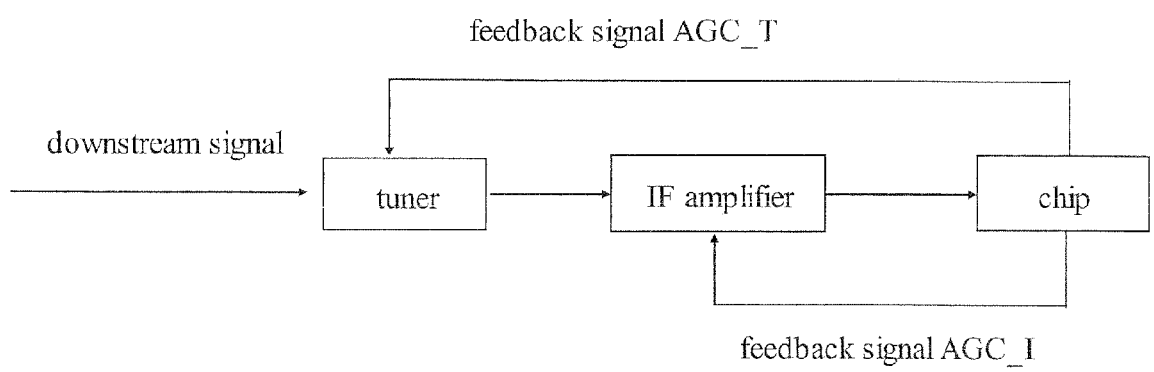
FIG. 1 is a block diagram of a signal receiving assembly of a conventional cable modem.
Figure 2:
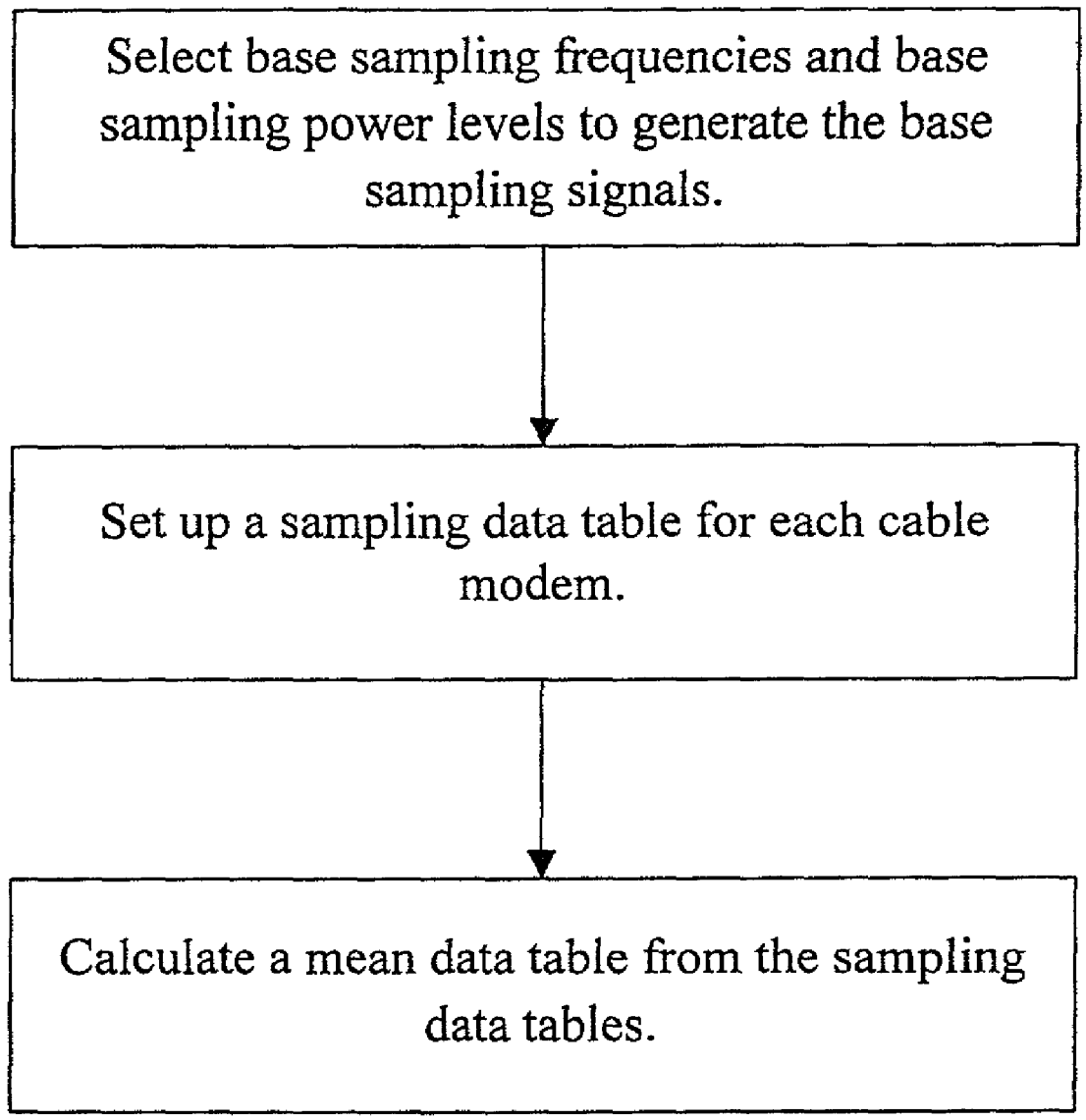
FIG. 2 is a flow chart of a preliminary operation step according to a preferred embodiment of the present invention.

As indicated in FIG. 2, the preliminary operation step consists of the following procedures:

(A) Select base sampling frequencies and base sampling power levels to generate a quantity of base sampling signals.

In terms of the base sampling frequencies, this involves selecting a quantity of frequency values based on low VHF, high VHF and UHF bands. According to the preferred embodiment of the present invention, we totally select 26 frequency values (in units of MHz) from these three frequency bands. These selected frequency values are list hereunder.

In low VHF band, six values are selected as follows:
93, 105, 129, 153, 159, and 163.6875
In high VHF band, ten values are selected as follows:
165, 189, 213, 273, 315, 333, 393, 441, 453, and 470.9375
In UHF band, ten values are selected as follows:
471, 507, 513, 573, 633, 669, 693, 753, 813 and 855

In terms of the base sampling power levels, the preferred embodiment has a range of −18 dBmV to +16 dBmV, with sampling point selection configured in increments of 2 dBmV. In other words, available selections include −18 dBmV, −16 dBmV, −14 dBmV, −10 dBmV, −8dBmV, −6 dBmV, −4 dBmV, −2 dBmV, 0 dBmV, +2 dBmV, +4 dBmV, +6 dBmV, +8 dBmV, +10 dBmV, +12 dBmV, +14 dBmV and +16 dBmV, providing a total of 18 base sampling power level values. (Note: Under DOCSIS protocols, the input signal level ranges from −15 dBmV to 15 dBmV, but the power level selection range of the procedure herein is larger than that of the range.)

The selecting operation generates 26 base sampling frequency values and 18 base sampling power level values, which when multiplied together provides for a total of 468 base sampling signals. In other words, from "93 MHz, −18 dBmV", "93 MHZ, −16 dBmV", and "93 MHz, 14 dBmV", etc. to "855 MHz, +12 dBmV", "855 MHZ, +14 dBmV", and "855 MHz, +16 dBmV".

(B) Set up a sampling data table for each cable modem among a plurality of cable modems.

Provide several hundred cable modems and consecutively input the base sampling signals into each modem. For every modem, obtain every sum of the feedback signals AGC_T and AGC_I, which are generated by the modem chip and responding to the tuner and the IF amplifier, corresponding every said base sampling signal.

In other words, for any certain modem, (utilizing a signal generator) an initial sampling signal such as "93 MHz, −18 dBmV" is first inputted and the AGC_T and AGC_I values relative to the inputted sampling signal in the temporary storage device of the modem chip are totaled and read, following which the next sampling signal of "93 MHz, −16 dBmV" is inputted and the sum of AGC_T and AGC_I are read, and the process is repeated until the recording of all said 468 base sampling signals and the corresponding sum values is completed. Therefore, the sampling data table of this particular modem is set up by recording the 468 sum values. It is to be understood that the sampling data table can be visualized as a matrix containing 26 columns and 18 rows.

The sampling data table of each modem is set up in an identical manner. However, the sampling data table content of each modem varies due to the differing frequency response of individual tuners, as previously described.

It is to be noted that the meaning conveyed by the sampling data tables is subject to the interacting nature of the chip and tuner in each cable modem and, as such, the recorded values of the AGC_T added to the AGC_I are attributed to the internal operation of the modem, wherein when the downstream signal power is sufficiently high, the tuner only amplifies or attenuates the power level (the auto gain control of the intermediate frequency maintains it at a certain value) into the chip. On the contrary, when the downstream signal power is too low such that the auto gain control of the tuner at its highest capability cannot provide the power required for chip reception and processing, the auto gain control of the intermediate frequency amplifies it to an appropriate level (the auto gain control of the tuner maintaining power level at a maximum value); as such, the AGC_T and AGC_I sums are recorded into the sampling data table.

(C) Calculate a mean data table based on the sample data tables.

A 26×18 mean data table (by definition, a table in which values of each sampling signal data in the several hundred data tables are totaled and divided) is calculated according to the several hundred sampling data tables to thereby reflect the essential characteristics of the interactive process occurring between the chip and tuners in this model of cable modems. In other words, calculate every mean of the sums of the feedback signals of all the sampling data tables under every same base sampling signal, thereby setting up a mean data table containing each mean value of the sum value of the feedback signals of all the sampling data tables corresponding each same base sampling signal.

The preliminary operations of the present invention must be individually executed once (and only once) to cable modems on the production line that have previously not been power calibrated.

Referring to FIG. 3, the individual operation is executed once for each modem as they are produced and consists of the following procedures:

(D) Choose a predetermined quantity of spot frequencies and spot power levels from the base sampling frequencies and base sampling power levels to generate a smaller quantity of spot sampling signals.

In terms of spot frequencies, a quantity of frequency values are selected in three frequency bands. We select 15 spot frequency values from the 26 base sampling frequencies, which are selected during the preliminary operation step. According to this preferred embodiment of the present invention, the selected spot frequency values (in units of MHz) are listed hereunder.

In low VHF band, four values are selected as follows:
93, 105, 129 and 153
In high VHF band, six values are selected as follows:
165, 189, 315, 393, 441 and 453
In UHF band, five values are selected as follows:
471, 573, 693, 813 and 855

In terms of spot power levers, we select 6 spot power level values from the 18 base sampling power level values, which are selected during the preliminary operation step. According to this preferred embodiment of the present invention, the selected spot power level values are −16 dBmV, −12 dBmV, −6 dBmV, 0 dBmV, +6 dBmV and +12 dBmV The selecting operation generates 15 spot frequency values and 6 spot power level values, which when multiplied together provides for a total of 90 spot sampling signals.

(E) Set up a skeleton data table for cable modem calibration.

Similarly, for every modem to be calibrated, obtain every sum of the feedback signals AGC_T and AGC_I, which are generated by the modem chip and responding to the tuner and the IF amplifier, corresponding every said spot sampling signals.

In other words, for a certain cable modem, an initial spot sampling signal such as "93 MHz, −16 dBmV" is first inputted and the sum of the AGC_T and AGC_I values corresponding the inputted spot sampling signal in the temporary storage device of the modem chip is read, following which a next spot sampling signal of "93 MHz, 12 dBmV" is inputted and the sum of the AGC_T and AGC_I values is read, and the routine is repeated until the recording of all said 90 spot sampling signals and the corresponding sum values is completed, thereby setting up a 15×6 skeleton data table for this particular modem.

(F) Expand said sum values in the skeleton data table from the corresponding said spot power levels into corresponding said base sampling power levels.

According to the preferred embodiment herein, the skeleton data table is in a 15 (frequency)×6 (power level) chart format having 15 spot frequencies with the values of six spot power levels under each spot frequency, the procedure then expands the six sum values under the spot frequencies into 18 (that respectively correspond to the base sampling power levels). The method for any given spot frequency is as follows:

(a) Based on the contents in said skeleton data table, to expand the six sum values corresponding −16 dBmV, −12 dBmV, −6 dBmV, 0 dBmV, +6 dBmV and +12 dBmV respectively under the frequencies, mathematically interpolation is applied to derive nine corresponding base power level values of −14 dBmV, −10 dBmV, −8 dBmV, −4 dBmV, −2 dBmV, +2 dBmV, +4 dBmV, +8 dBmV, and −10 dBmV, following which the three corresponding base power levels of −18 dBmV, +14 dBmV, and +16 dBmV are derived through extrapolation. The sum values calculated through this operation are each termed an arithmetic sum value. In other words, calculate the sum values corresponding said base sampling power levels excluding those equal to the spot power levels from the sum values corresponding said spot power levels in skeleton data table by interpolation or extrapolation. These calculated sum values are called as arithmetic sum values.

(b) Moreover, under the same given frequency, obtain 12 mean values from the mean data table corresponding the base sampling power level value of −16 dBmV, −14 dBmV, −10 dBmV, −8 dBmV, −4 dBmV, −2 dBmV, +2 dBmV, +4 dBmV, +8 dBmV, +10 dBmV, +14 dBmV, and +16 dBmV, that is, obtain the mean values corresponding said base sampling power levels excluding those equal to the spot power levels in the mean data table. These means mean values are termed weighting sum values.

(c) Based on the arithmetic sum values and weighting sum values, the formula "Computational Sum Value=(Weighting Sum Value×2+Arithmetic Sum Value)÷3" provides for the calculation of the computational sum values corresponding the base sampling power level values excluding those equal to the spot power level values. Therefore, the computational sum values as well as the original sum values corresponding the spot power level values in the skeleton data table form the complete sum values corresponding said base sampling power level values under the given spot frequency.

For example, for a given spot frequency, the sum value (computational sum value) corresponding −18 dBmV, which is not chosen for a spot power level value but is chosen as a base sampling power level value, can be calculated hereinafter, that is, the mean value (weighting sum value) corresponding −18 dBmV under the same frequency in the mean data table is multiplied by two and then the product is added to the arithmetic sum value corresponding −18 dBmV under the same frequency in the skeleton table, and finally the total is divided by three.

(G) Derive an individual default data table from information in the skeleton table based on the corresponding spot frequencies expanded into corresponding base sampling frequencies.

In current skeleton data table for a certain cable modem and for one of the fifteen spot frequencies, there are 18 corresponding sum values respectively. Interpolate information in the skeleton data table to expand it from the corresponding said spot frequencies and base sampling power level values into corresponding said base sampling frequencies and base sampling power level values, thereby expanding the skeleton data table into an individual default data table containing default sum vales corresponding said base sampling signals.

It should be noted at this juncture that if a certain frequency is derived by interpolation, the operation should not be attempted if the reference frequencies on both sides are not within the same frequency band; the closest said frequency is directly selected instead and, furthermore, the replacement data under the frequency must be within the same frequency band. For example, 333 MHz is not among the original six sample frequencies and the 18 corresponding information under it consists of data interpolated from the frequencies 315 MHz and 393 MHz at the two sides. However, if the desired frequency is 470.9375 MHz, since the frequencies 453 MHz and 471 MHz at its two sides are in different frequency bands of high VHF and UHF respectively, interpolation cannot be utilized and 453 MHz (high VHF band) frequency data is utilized instead.

As such, the original 15×6 skeleton data table that is now currently expanded into a 26×18 data table serving as an individual default data table for the certain cable modem.

With the method provided by the present invention, each cable modem on the production line has a 26 (frequency)×18 (power level) individual default data table and its scope of data is identical to that set up by conventional calibration operations. As such, the invention herein completes the power level calibration of each cable modem and when the modem is actually operated, the signal power level is calculated according to the individual default data table.

Figure 4:
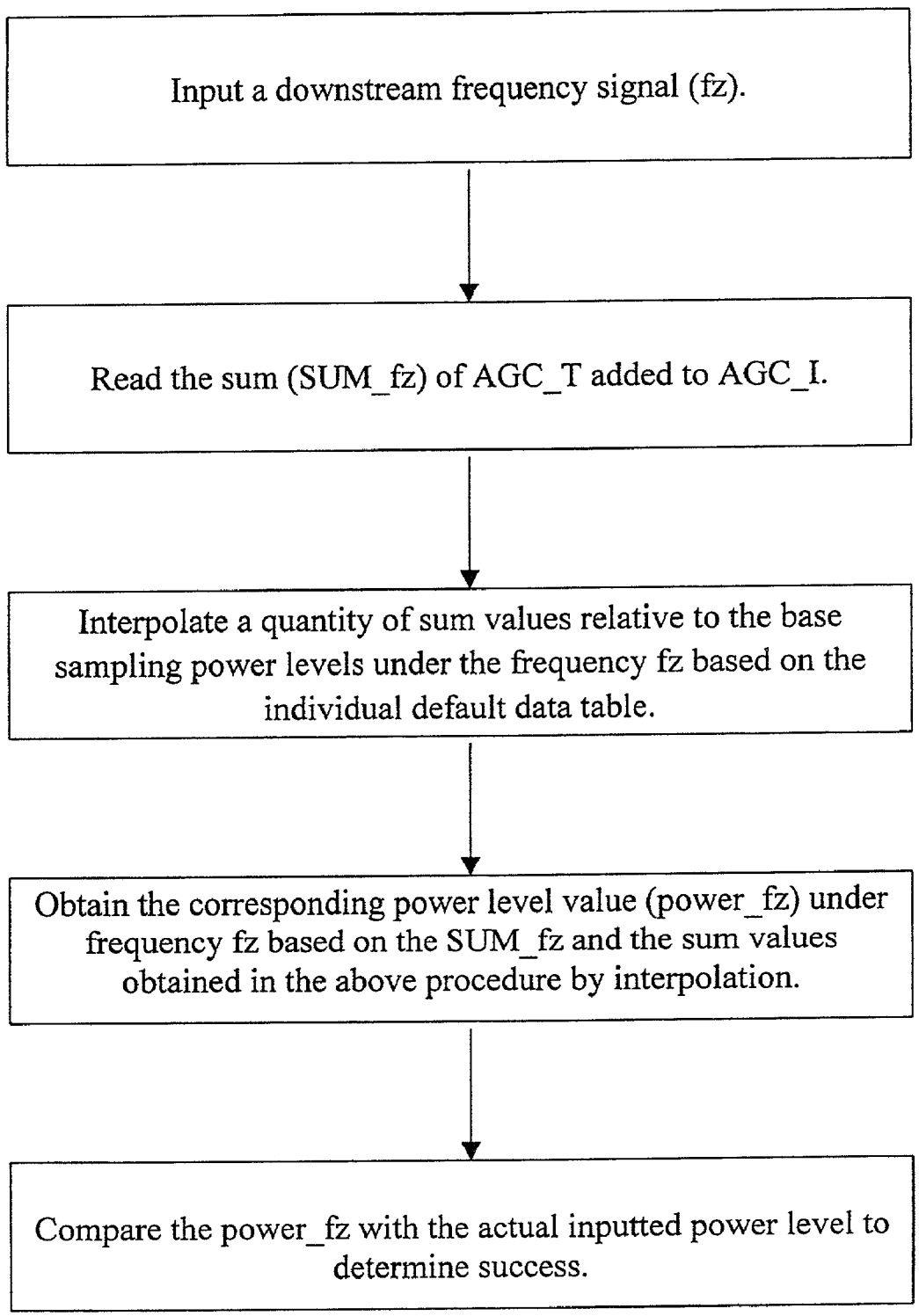
FIG. 4 is a flow chart of a testing operation step according to the preferred embodiment of the present invention.

Following the cable modem calibration operation, an inspection operation is conducted at the production line, referring to FIG. 4, the process of which consists of the following procedures:

(H) Input a test downstream signal, the specific frequency (fz) of which is between 88 MHz and 860 MHz (the DOCSIS stipulated frequency range).

(I) Read the sum value (SUM fz) of the feedback signals AGC_T and AGC_I generated by the modem chip under the signal.

(J) Obtain 18 sum values corresponding 18 base sampling power levels under the frequency fz based on the individual default data table of this particular modem by interpolation.

(K) Obtain the corresponding power level value (power_fz) under frequency fz based on the SUM_fz and the 18 sum values obtained in procedure (J) by interpolation.

(L) Following the table inspection, the calculated said power_fz is compared with the power level value of the actually inputted test signal; if the difference is less than 3 dBmV and, furthermore, the actual input power level value is adjusted to increase/decrease 1 dBmV and the power_fz fluctuation does not exceed +1.5 dBmV or −0.5 dBmV, this indicates that the cable modem has been successfully calibrated and its function meets DOCSIS protocols.

After the inventor of the present invention actually tested the method, it was found that if an individual default data table was set up for each modem by following the procedures, the produced modems passed the inspection and thus complied with DOCSIS requirements.

In light of the above, it should be known that a conventional cable modem power calibration method requires 468 signal inputs and data readings that consume much time and effort. However, since the method provided by the present invention only requires 90 inputs and readings per modem and, furthermore, data calculation is programmed, this significantly reduces data table set-up time. The mathematics operation-assisted completion of the data tables also enables the cable modems to perform according to specifications and there were no serious measurement discrepancies in during data table set-up.

As such, the downstream power calibration method on the cable modem provided by the present invention is capable of accurate power calibration, while also greatly reducing calibration time and increasing cable modem production rate.

What is claimed is:

1. A downstream power calibration method on cable modems adapted to set up an individual default data table in each cable modem for calculating the power levels of downstream signals received by the cable modem, the cable modem comprising a tuner, an intermediate frequency amplifier and a modem chip generating feedback signals responding to said tuner and said intermediate frequency amplifier respectively while receiving an inputted signal, the calibration method comprising a preliminary operation step to be executed once and an individual operation step to be executed once for each cable modem;

wherein said preliminary operation step comprises the following procedures:

(A) selecting a quantity of frequency values to serve as base sampling frequencies and then selecting a quantity of power level values to serve as base sampling power levels, thereby generating base sampling signals; wherein the quantity of the base sampling signals is equal to the product of the base sampling frequencies multiplied by the base sampling power levels;

(B) providing a plurality of cable modems and consecutively inputting the base sampling signals into each modem; for each modem, obtaining each sum of the feedback signals responding to the tuner and the IF amplifier by the modem chip corresponding to each said base sampling signal, thereby setting up a sampling data table containing each sum value of the feedback signals corresponding to each base sampling signal for each cable modem;

(C) calculating each mean of the sum values of all the sampling data tables under each same base sampling signal, thereby setting up a mean data table containing each mean value of the sum values of all the sampling data tables corresponding to each same base sampling signal;

wherein said individual operation step comprises the following procedures:

(D) selecting a quantity of spot frequencies and spot power levels from the base sampling frequencies and the base sampling power levels to generate spot sampling signals, wherein the quantity of which is less than that of the base sampling signals;

(E) inputting consecutively the spot sampling signals into a cable modem and obtaining each sum of the feedback signals responding to the tuner and the IF amplifier of this modem by its modem chip corresponding to each said spot sampling signal, thereby setting up a skeleton data table containing each sum value of the feedback signals corresponding to each spot sampling signal;

(F) expanding said sum values in the skeleton data table from corresponding spot power levels into corresponding base sampling power levels for any given spot frequency by the following procedures:

(a) calculating the sum values corresponding to said base sampling power levels excluding those equal to the spot power levels from the sum values corresponding to said spot power levels in the skeleton data table by interpolation or extrapolation, wherein these calculated sum values are termed arithmetic sum values;

(b) obtaining the mean values corresponding to said base sampling power levels excluding those equal to the spot power levels in the mean data table, wherein these mean values are termed weighting sum values;

(c) calculate computational sum values corresponding to said base sampling power levels excluding those equal to the spot power levels in the skeleton data table by the formula as follows:

computational sum value=(weighting sum value×2+ arithmetic sum value)÷3 whereby each sum value corresponding to each base sampling power level under each spot frequency for the modem is obtained in the skeleton data table;

(G) interpolating or extrapolating information in the skeleton data table such that the sum values corresponding to said spot frequencies and said base sampling power levels are expanded into sum values corresponding to said base sampling frequencies and said base sampling power levels, thereby expanding the skeleton data table into the individual default data table for the modem and providing for the calculation of power levels when the cable modem is receiving downstream signals.

2. The calibration method as defined in claim 1, wherein the base sampling frequencies in procedure (A) are 93 MHz, 105 MHz, 129 MHz, 153 MHz, 159 MHz, 163 MHz, 163.6875 MHz, 165 MHz, 189 MHz, 213 MHz, 273 MHz, 315 MHz, 333 MHz, 393 MHz, 441 MHz, 453 MHz, 470.9375 MHz, 471 MHz, 507 MHz, 513 MHz, 573 MHz, 633 MHz, 669 MHz, 693 MHz, 753 MHz, 813 MHz and 855 MHz.

3. The calibration method as defined in claim 2, wherein the spot frequencies in procedure (D) are 93 MHz, 105 MHz, 129 MHz, 153 MHz, 165 MHz, 189 MHz, 315 MHz, 393 MHz, 441 MHz, 453 MHz, 471 MHz, 573 MHz, 693 MHz, 813 MHz and 855 MHz which are chosen from the base sampling frequencies.

4. The calibration method as defined in claim 1, wherein the base sampling power levels in procedure (A) are −18 dBmv, −16 dBmV, −14 dBmV, −12 dBmV, −10 dBmV, −8 dBmV, −6 dBmV, −4 dBmV, −2 dBmV, 0 dBmV, +2 dBmV, +4 dBmV, +6 dBmV, +8 dBmV, +10 dBmV, +12 dBmV, +14 dBmV and +16 dBmV.

5. The calibration method as defined in claim 4, wherein the spot power levels in procedure (D) are −16 dBmV, −12 dBmV, −6 dBmV, 0 dBmV, +6 dBmV, and +12 dBmV.

6. The calibration method as defined in claim 1, when a sum value corresponding to a certain frequency is calculated in procedure (G) and the reference frequencies at its two sides are in different frequency bands, then the one of the reference frequencies which is closest to said certain frequency and in the same frequency band is directly selected for extrapolation.

* * * * *